US012772747B2

(12) United States Patent
Jeong et al.

(10) Patent No.: US 12,772,747 B2
(45) Date of Patent: Oct. 20, 2026

(54) TEMPLATING LAYERS FOR GROWTH OF PERPENDICULARLY MAGNETIZED HEUSLER FILMS

(71) Applicants: Samsung Electronics Co., Ltd., Suwon-si (KR); International Business Machines Corporation, Armonk, NY (US)

(72) Inventors: Jaewoo Jeong, Los Altos, CA (US); Ikhtiar, San Jose, CA (US); Panagiotis Charilaos Filippou, Fremont, CA (US); Chirag Garg, San Jose, CA (US); Mahesh Samant, San Jose, CA (US)

(73) Assignees: International Business Machines Corporation, Armonk, NY (US); Samsung Electronics Co., Ltd., Gyeonggi-do (KR)

( * ) Notice: Subject to any disclaimer, the term of this patent is extended or adjusted under 35 U.S.C. 154(b) by 496 days.

(21) Appl. No.: 18/218,926

(22) Filed: Jul. 6, 2023

(65) Prior Publication Data

US 2024/0349622 A1 Oct. 17, 2024

(30) Foreign Application Priority Data

Apr. 12, 2023 (GR) .............................. 20230100324

(51) Int. Cl.
*H10N 50/85* (2023.01)
*H10B 61/00* (2023.01)
*H10N 50/01* (2023.01)
*H10N 50/10* (2023.01)

(52) U.S. Cl.
CPC ............. *H10N 50/85* (2023.02); *H10B 61/00* (2023.02); *H10N 50/01* (2023.02); *H10N 50/10* (2023.02)

(58) Field of Classification Search
CPC .......... H10N 50/85; H10B 61/00; H01F 10/30
See application file for complete search history.

(56) References Cited

U.S. PATENT DOCUMENTS 8,445,981 B2 5/2013 Lim et al.
9,025,371 B1 5/2015 Huai et al.
9,236,564 B2 1/2016 Carey et al.
(Continued)

FOREIGN PATENT DOCUMENTS

WO WO 2018/080159 A1 5/2018

OTHER PUBLICATIONS

A.J. McAlister, The Al—Co (Aluminum-Cobalt) System, Bulletin of Alloy Phase Diagrams vol. 10 No. 6 1989, pp. 646-650 (Year: 1989).*

*Primary Examiner* — Shih Tsun A Chou
(74) *Attorney, Agent, or Firm* — Womble Bond Dickinson (US) LLP

(57) ABSTRACT

A magnetic memory device includes a substrate, a seed layer above the substrate, a chemical templating layer above the seed layer, and a first magnetic layer above the chemical templating layer. The seed layer includes $Sc_xN$, $Mn_xN$, or MgO substantially oriented in (001) direction. The chemical templating layer includes a binary alloy having a $Cu_3Au$ prototype structure or a $BiF_3$ prototype structure. The first magnetic layer includes a Heusler compound having perpendicular magnetic anisotropy.

20 Claims, 6 Drawing Sheets

(56) References Cited

U.S. PATENT DOCUMENTS

| | | | | |
|---|---|---|---|---|
| 9,966,091 | B2 | 5/2018 | Chen et al. | |
| 10,867,625 | B1 | 12/2020 | Freitag et al. | |
| 2019/0305040 | A1 * | 10/2019 | Jeong | H10B 61/00 |

* cited by examiner $Cu_3Au$–TYPE $BiF_3$ TYPE

TEMPLATING LAYERS FOR GROWTH OF PERPENDICULARLY MAGNETIZED HEUSLER FILMS

CROSS-REFERENCE TO RELATED APPLICATION

This application claims priority to and the benefit of Greek Patent Application No. 20230100324, filed on Apr. 12, 2023, the entire content of which is hereby incorporated by reference.

BACKGROUND

1. Field

The present disclosure relates to magnetic memory devices and chemical templating layers for the growth of perpendicularly magnetized Heusler films.

2. Description of the Related Art

Magnetic random-access memory (MRAM) devices store information utilizing magnetic materials as an information recording medium. One type of MRAM is a spin-transfer-torque magnetic random-access memory (STT-MRAM). STT-MRAM devices include a magnetic tunnel junction (MTJ) having a tunnel barrier layer stacked between a magnetic free layer and a magnetic pinned (or fixed) layer. To write to a STT-MRAM device, current is driven through the MTJ, which causes the magnetic moment of the free layer to be either aligned or anti-aligned with the magnetic moment of the pinned layer using spin transfer torque (STT). To read from the STT-MRAM, a read current passes through the MTJ.

SUMMARY

The present disclosure relates to various embodiments of a magnetic memory device, such as a spin-transfer-torque magnetic random-access memory (STT-MRAM) device or a racetrack memory device. In one embodiment, the magnetic memory device includes a substrate, a seed layer on the substrate, a chemical templating layer on the seed layer, and a first magnetic layer on the chemical templating layer. The chemical templating layer includes a binary alloy having a $Cu_3Au$ prototype structure or a $BiF_3$ prototype structure, and the first magnetic layer includes a Heusler compound having perpendicular magnetic anisotropy.

The seed layer may be $Sc_xN$, $Mn_xN$, or MgO substantially oriented in (001) direction.

The Heusler compound may be $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, or $Co_2MnSi$. The Heusler compound may be $Mn_3Ge$.

The first magnetic layer may have a thickness less than approximately 5 nm.

The binary alloy may be represented by $A_{1-x}E_x$, where A is a transition metal element and E is a main group element, and where x is in a range from 0.2 to 0.3. Additionally, A may be cobalt (Co), nickel (Ni), Scandium (Sc), or iron (Fe), and E may be aluminum (Al), germanium (Ge), or gallium (Ga).

The magnetic memory device may also include a tunnel barrier layer on the first magnetic layer.

The tunnel barrier layer may include MgO.

The tunnel barrier layer may include $Mg_{1-z}Al_{2+(2/3)z}O_4$, where z is between −0.5 and 0.5.

The tunnel barrier layer may include $MgAl_2O_4$.

The tunnel barrier layer may be in contact with the first magnetic layer.

The magnetic memory device may also include a second magnetic layer on the tunnel barrier layer.

The first magnetic layer including the Heusler compound may be a free magnetic layer, and the second magnetic layer may be a pinned magnetic layer.

The pinned magnetic layer may include a synthetic anti-ferromagnet (SAF) layer.

The first magnetic layer including the Heusler compound may be a pinned magnetic layer, and the second magnetic layer may be a free magnetic layer.

The magnetic memory device may include a cap layer on the second magnetic layer.

The magnetic memory device may include a CsCl-type chemical templating layer on the seed layer. The chemical templating layer may be on the CsCl-type chemical templating layer.

The CsCl-type chemical templating layer may include a binary alloy having a CsCl prototype structure. The binary alloy may be CoAl.

The present disclosure also relates to various embodiments of a method of forming a magnetic memory device. In one embodiment, the method includes forming a seed layer on a substrate, forming a chemical templating layer on the seed layer, and growing a first magnetic layer on the chemical templating layer. The chemical templating layer includes a binary alloy having a $Cu_3Au$ prototype structure or a $BiF_3$ prototype structure, and the $Cu_3Au$ prototype structure or a $BiF_3$ prototype structure of the chemical templating layer causes the first magnetic layer to include a Heusler compound having perpendicular magnetic anisotropy.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

The features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

Figure 1:
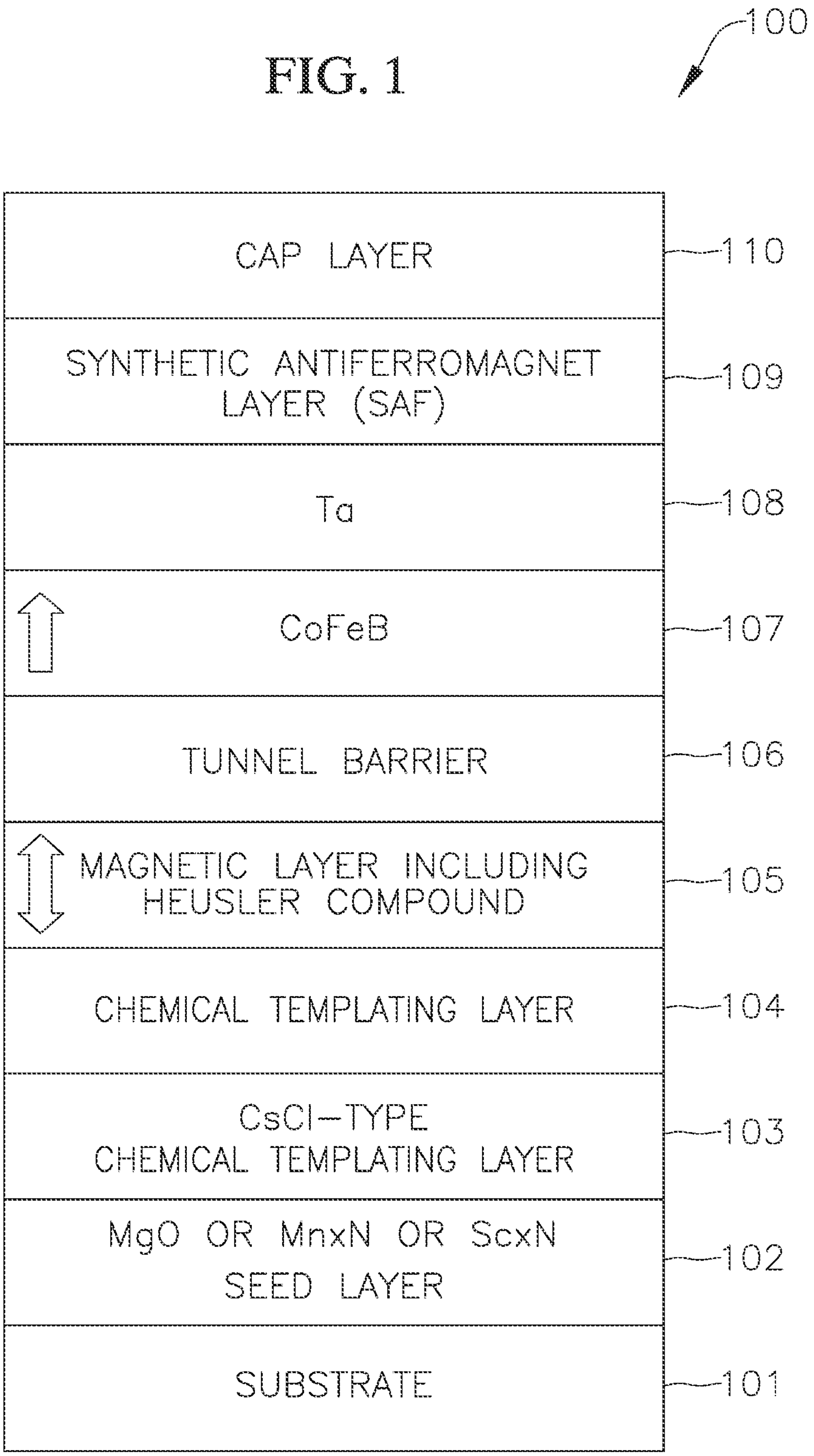
FIG. 1 is a cross-sectional view of a magnetic memory device according to one embodiment of the present disclosure including a magnetic layer with a Heusler compound, and a chemical templating layer having a binary alloy with a $Cu_3Au$ prototype structure or a $BiF_3$ prototype structure.

The present disclosure relates to various embodiments of a magnetic memory device, such as a spin-transfer torque magnetoresistive random-access memory (STT-MRAM) device, having a Heusler compound layer. Heusler compounds have perpendicular magnetic anisotropy (PMA), low moment due to ferrimagnetic configuration, and large anisotropy. These STT-MRAM devices may include a ferromagnetic Heusler compound. The moment of the Heusler compound depends on the constituent elements. These properties enable fast switching (e.g., less than approximately 20 nanoseconds) of the STT-MRAM device with relatively lower switching current compared to in-plane magnetized magnetic tunnel junctions (MTJs) or higher moment materials, such as CoFe alloys, with the same thermal energy barrier.

The magnetic memory devices of the present disclosure also include a chemical templating layer for forming (growing) the Heusler compound layer. In one or more embodiments, the chemical templating layer includes a binary alloy having a $Cu_3Au$ prototype structure or a $BiF_3$ prototype structure. In one or more embodiments, the binary alloy of the chemical templating layer includes an alternating layered structure of a transition element and a main group element.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The example embodiments are described in the context of particular magnetic junctions and magnetic memories having certain components. One of ordinary skill in the art will readily recognize that embodiments of the present invention are consistent with the use of magnetic junctions and magnetic memories having other and/or additional components and/or other features not inconsistent with embodiments of the present invention. The method and system are also described in the context of current understanding of spin-orbit interaction, the spin transfer phenomenon, of magnetic anisotropy, and other physical phenomena. Consequently, one of ordinary skill in the art will readily recognize that theoretical explanations of the behavior of the method and system are made based upon this current understanding of spin-orbit interaction, spin transfer, magnetic anisotropy and other physical phenomenon. However, the methods and systems described herein are not dependent upon a particular physical explanation. One of ordinary skill in the art will also readily recognize that the methods and systems are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions, spin-orbit interaction active layers, and/or other structures having particular layers. However, one of ordinary skill in the art will readily recognize that magnetic junctions, spin-orbit interaction active layers, and/or other structures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions. However, one of ordinary skill in the art will readily recognize that the method and system are consistent with the use of magnetic memories having multiple magnetic junctions. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

With reference now to FIG. 1, a magnetic memory device 100 according to one embodiment of the present disclosure includes a substrate 101, a seed layer 102 above the substrate 101, a CsCl-type chemical templating layer 103 above the seed layer 102, a chemical templating layer 104 above the CsCl-type chemical templating layer 103, a first magnetic layer 105 comprising a Heusler compound above the chemical templating layer 104, a tunnel barrier layer 106 above the first magnetic layer 105, a second magnetic layer 107 above the tunnel barrier layer 106, a tantalum (Ta) layer 108 above the second magnetic layer 107, a synthetic antiferromagnetic (SAF) 109 layer above the Ta layer 108, and a cap layer 110 above the SAF layer 109. In one or more embodiments, the second magnetic layer 107 comprises CoFeB (e.g., an alloy of Co, Fe, and B where the composition may be of the form $(CoFe)_{1-x}B_x$, where x is in a range from approximately 0.15 to approximately 0.35 ($0.15 \leq x \leq 0.35$), or an alloy of Co, Fe, and B where the composition may be of the form $(Co_{1-x}Fe_x)_{1-y}B_y$ where x is in a range from approximately 0.3 to approximately 0.7 ($0.3<x<0.7$) and y is in a range from approximately 0.15 to approximately 0.5 ($0.15<y<0.5$)). In one or more embodiments, the magnetic memory device 100 may not include the CsCl-type chemical templating layer 103. Additionally, in one or more embodiments, the magnetic memory device 100 may include a polarization enhancement layer above the first magnetic layer 105 (e.g., between the first magnetic layer 105 and the tunnel barrier layer 106), although in one or more embodiments the magnetic memory device 100 may not include the polarization enhancement layer. As described in more detail below, the chemical templating layer 104 is configured to enable growth of the ordered Heusler compound at ultrathin thickness and at room temperature. The term "Heusler compound" refers to a magnetic intermetallic with a face-centered cubic crystal structure and a composition of XYZ (for half-Heuslers) or $X_2YZ$ (for full-Heuslers), where X and Y are transition metals and Z is in the p-block of the periodic table (i.e., elements in groups 13 to 18).

Together, the first magnetic layer 105 including the Heusler compound, the tunnel barrier layer 106, and the second magnetic layer 107 define a magnetic tunnel junction (MTJ). Additionally, in the illustrated embodiment, the second magnetic layer 107 has a fixed (or pinned) magnetization direction that is perpendicular to a surface of the second magnetic layer 107 (i.e., perpendicular to the tunnel barrier layer 106), and the magnetization direction (or state) of the first magnetic layer 105 having the Heusler compound is substantially perpendicular to the surface of the first magnetic layer 105 (i.e., perpendicular to the tunnel barrier layer 106) and is configured to switch to be either aligned or anti-aligned with the magnetization direction of the second magnetic layer 107 using spin transfer torque (STT). In this manner, the MTJ is a bi-stable system in which the second magnetic layer 107 functions as a reference layer and the first magnetic layer 105 including the Heusler compound functions as the bit storage layer.

In one or more embodiments, the tunnel barrier layer 106 comprises MgO. In one or more embodiments, the tunnel barrier layer 106 may be $MgAl_2O_4$ and the lattice spacing of the tunnel barrier layer 106 can be tuned (engineered) by controlling the Mg—Al composition to result in better lattice matching with the Heusler compound of the first magnetic layer 105. For example, in one or more embodiments, the tunnel barrier layer 106 can be represented as $Mg_{1-z}Al_{2+(2/3)z}O_4$ in which z is between −0.5 and 0.5.

In one or more embodiments, the seed layer 102 may include $Sc_xN$, $Mn_xN$, or MgO oriented (or substantially oriented) in the (001) direction. The term "(001) direction" refers to Miller indices. The seed layer 102 is configured to enable growth of the CsCl-type chemical templating layer 103. The substrate 101 is also configured to enable (001) growth of the above-mentioned seed layer 102 (e.g., a terminating layer on the substrate 101 is amorphous). In one or more embodiments, the CsCl-type chemical templating layer 103 includes a binary compound having a CsCl prototype structure. As used herein, the term "CsCl prototype structure" refers to a crystal structure having a Strukturbericht designation of B2, a Pearson symbol of cP20, a simple cubic Bravais Lattice, a space group of Pm$\bar{3}$m, and a space group number of 221. In one or more embodiments, the binary alloy having the CsCl prototype structure may be CoAl oriented (or substantially oriented) in the (001) direction (i.e., Miller indices (001)) and include an alternating layered structure of cobalt (Co) atoms and aluminum (Al) atoms.

The Heusler compound of the first magnetic layer 105 has perpendicular magnetic anisotropy (PMA), low moment due to ferrimagnetic configuration, and large anisotropy. In one or more embodiments, the Heusler compound of the first magnetic layer 105 includes a plurality of layers alternating between a layer including only a transition metal element, and another layer including a main group element and a transition metal element. For instance, in one or more embodiments, the Heusler compound includes a plurality of layers alternating between a layer of Mn—Mn atoms and a layer of Mn—Ge atoms. In one or more embodiments, the Heusler compound in the first magnetic layer 105 may be $Mn_3Z$, where Z is germanium (Ge), tin (Sn), or antimony (Sb), each of which has perpendicular magnetic anisotropy (PMA), low moment due to ferrimagnetic configuration, and large anisotropy. In one or more embodiments, the Heusler compound may be a tetragonal Heusler compound, such as $Mn_3Z$ in which Z is Ge, Sn, or Sb. For example, in one or more embodiments, the tetragonal Heusler compound may be $Mn_{3.3-x}Ge$, $Mn_{3.3-x}Sn$, or $Mn_{3.3-x}Sb$ in which x is in a range from 0 to 1.1. In one or more embodiments, the Heusler compound may be a ternary Heusler compound (e.g., $Mn_{3.3-x}Co_{1.1-y}Sn$, in which $x \leq 1.2$ and $y \leq 1.0$). In one or more embodiments, the Heusler compound may be $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, or $Co_2MnSi$.

Figure 2A:
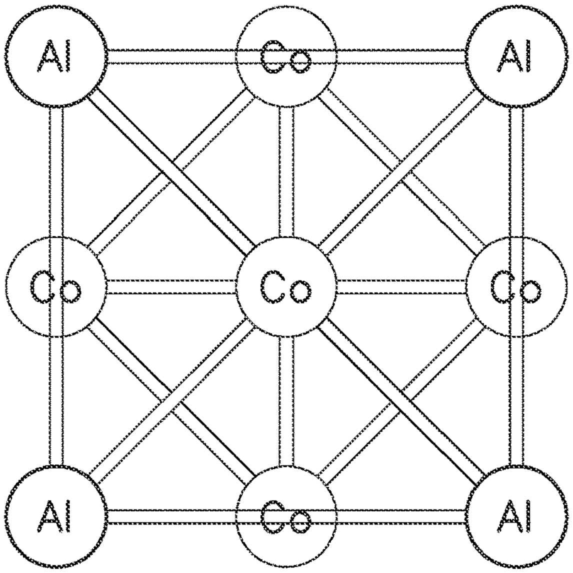
FIG. 2A-2B depict the binary alloy of $Co_3Al$ having a $Cu_3Au$ prototype structure and the binary alloy of $Cu_3Al$ having a $BiF_3$ prototype structure, respectively, according to embodiments of the present disclosure.
Figure 2B:
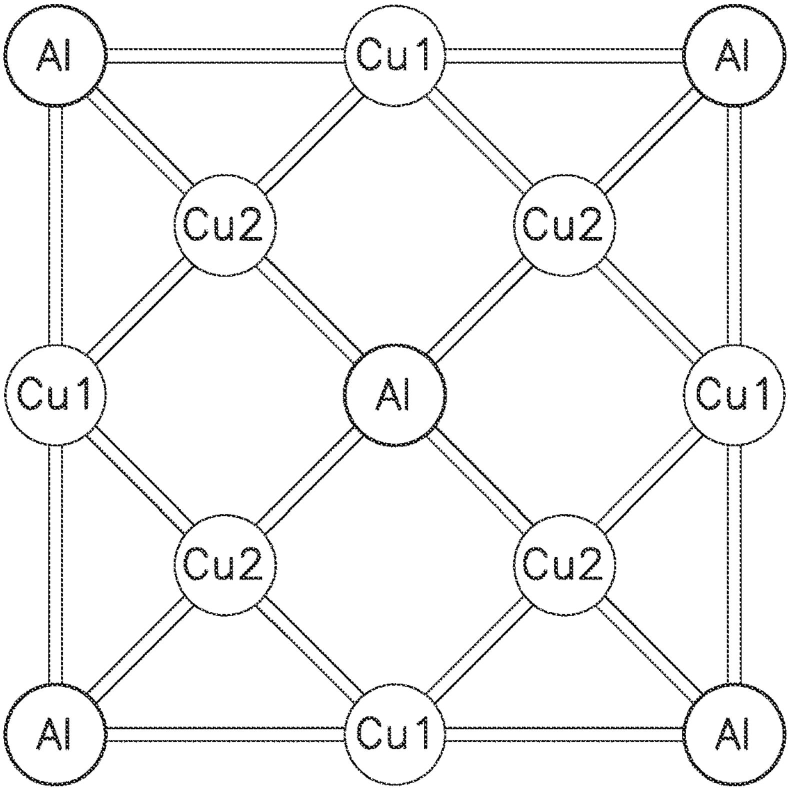

In one or more embodiments, the chemical templating layer 104 includes a binary alloy having a $Cu_3Au$ prototype structure or a $BiF_3$ prototype structure. As used herein, the term "$Cu_3Au$ prototype structure" refers to a crystal structure having a Strukturbericht designation (and common name) of $L1_2$, a Pearson symbol of cP4, and a space group of Pm$\bar{3}$m, and a space group number of 221. Additionally, as used herein, the term "$BiF_3$ prototype structure" refers to a crystal structure having a Strukturbericht designation of $DO_3$, a Pearson symbol of cF16, a face-centered cubic (FCC) Bravais Lattice, a space group of Fm$\bar{3}$m, and a space group number of 225. FIG. 2A depicts the binary alloy having a $Cu_3Au$ prototype structure, and FIG. 2B depicts the binary alloy having a $BiF_3$ prototype structure.

In one or more embodiments, the binary alloy of the chemical templating layer 103 includes a plurality of layers alternating between a layer including only a transition metal element, and another layer including a main group element. In one or more embodiments, the binary compound of the chemical templating layer 104 is represented by $A_{1-x}E_x$, wherein A is a transition metal element, E is a main group element, and x is in a range from 0.2 to 0.3. For example, in one or more embodiments, A is cobalt (Co) or iron (Fe), and E is aluminum (Al) or gallium (Ga). Table 1 below depicts a variety of suitable binary compounds (and their associated prototype structure, $Cu_3Au$ or $BiF_3$) for the chemical templating layer 104 according to various embodiments of the present disclosure. As shown in Table 1 below, the binary compound of the chemical templating layer 104 may be $Co_3Al$, $Ni_3Al$, $Sc_3Al$, $Cu_3Al$, $Fe_3Al$, $Fe_3Ge$, $Ni_3Ge$, $Fe_3Ge$, $Fe_3Ga$, $Ni_3Ga$, $Sc_3Ga$, or $Fe_3Ga$.

TABLE 1

| Compound | Prototype Structure | Lattice Constant, a | a/Sqrt(2) | |
|---|---|---|---|---|
| $Co_3Al$ | $Cu_3Au$ | 3.655 Å | | Ferromagnetic |
| $Ni_3Al$ | $Cu_3Au$ | 3.57 Å | | Ferromagnetic |
| $Sc_3Al$ | $Cu_3Au$ | 4.1 Å | | Non-magnetic |
| $Cu_3Al$ | $BiF_3$ | 5.81 Å | 4.11 Å | Non-magnetic |
| $Fe_3Al$ | $BiF_3$ | 5.79 Å | 4.09 Å | Ferromagnetic |
| $Fe_3Ge$ | $Cu_3Au$ | 3.67 Å | | Ferromagnetic |
| $Ni_3Ge$ | $Cu_3Au$ | 3.59 Å | | Ferromagnetic |
| $Fe_3Ge$ | $BiF_3$ | 5.76 Å | 4.07 Å | Ferromagnetic |
| $Fe_3Ga$ | $Cu_3Au$ | 3.7 Å | | Ferromagnetic |
| $Ni_3Ga$ | $Cu_3Au$ | 3.58 Å | | Ferromagnetic |
| $Sc_3Ga$ | $Cu_3Au$ | 4.09 Å | | Non-magnetic |
| $Fe_3Ga$ | $BiF_3$ | 5.8 Å | 4.1 Å | Ferromagnetic |

Figure 3:
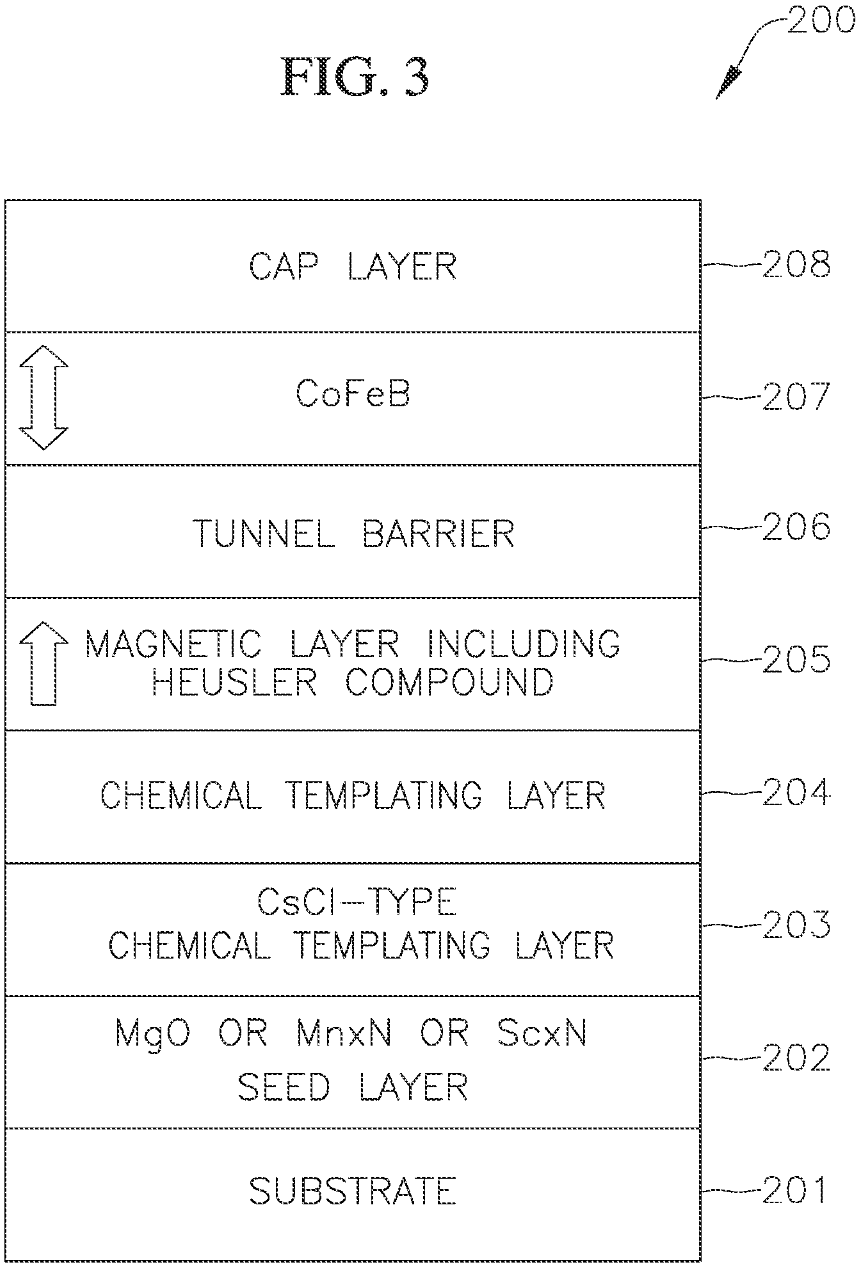
FIG. 3 is a cross-sectional view of a magnetic device according to another embodiment of the present disclosure.

With reference now to FIG. 3, a magnetic memory device 200 according to another embodiment of the present disclosure includes a substrate 201, a seed layer 202 above the substrate 201, a CsCl-type chemical templating layer 203 above the seed layer 202, a chemical templating layer 204 above the CsCl-type chemical templating layer 203, a first magnetic layer 205 comprising a Heusler compound above the chemical templating layer 204, a tunnel barrier layer 206 above the first magnetic layer 205, a second magnetic layer 207 above the tunnel barrier layer 206, and a cap layer 208 above the second magnetic layer 206. Additionally, in one or more embodiments, the magnetic memory device 200 may include a polarization enhancement layer above the first magnetic layer 204 (e.g., between the first magnetic layer 204 and the tunnel barrier layer 206), although in one or more embodiments the magnetic memory device 200 may not include the polarization enhancement layer. In one or more embodiments, the seed layer 202, the CsCl-type chemical templating layer 203, the chemical templating layer 204, the Heusler compound of the first magnetic layer 205, the tunnel barrier layer 206, the second magnetic layer 207, and the cap layer 208 may be the same as the seed layer 102, the CsCl-type chemical templating layer 103, the chemical templating layer 104, the Heusler compound of the first magnetic layer 105, the tunnel barrier layer 106, the second magnetic layer 107, and the cap layer 110, respectively, as described above with reference to the embodiment of the magnetic memory device 100 illustrated in FIG. 1.

Together, the first magnetic layer 205 including the Heusler compound, the tunnel barrier layer 206, and the second magnetic layer 207 define a magnetic tunnel junction (MTJ). Additionally, in the illustrated embodiment, the first magnetic layer 205 including the Heusler compound has a fixed (or pinned) magnetization direction that is perpendicular to the tunnel barrier layer 206, and the magnetization direction (or state) of the second magnetic layer 207 is configured to switch to be either aligned or anti-aligned with the magnetization direction of the first magnetic layer 205 using spin transfer torque (STT). In this manner, the MTJ is a bi-stable system in which the first magnetic layer 205 functions as a reference layer and the second magnetic layer 207 functions as the bit storage layer.

Figure 4:
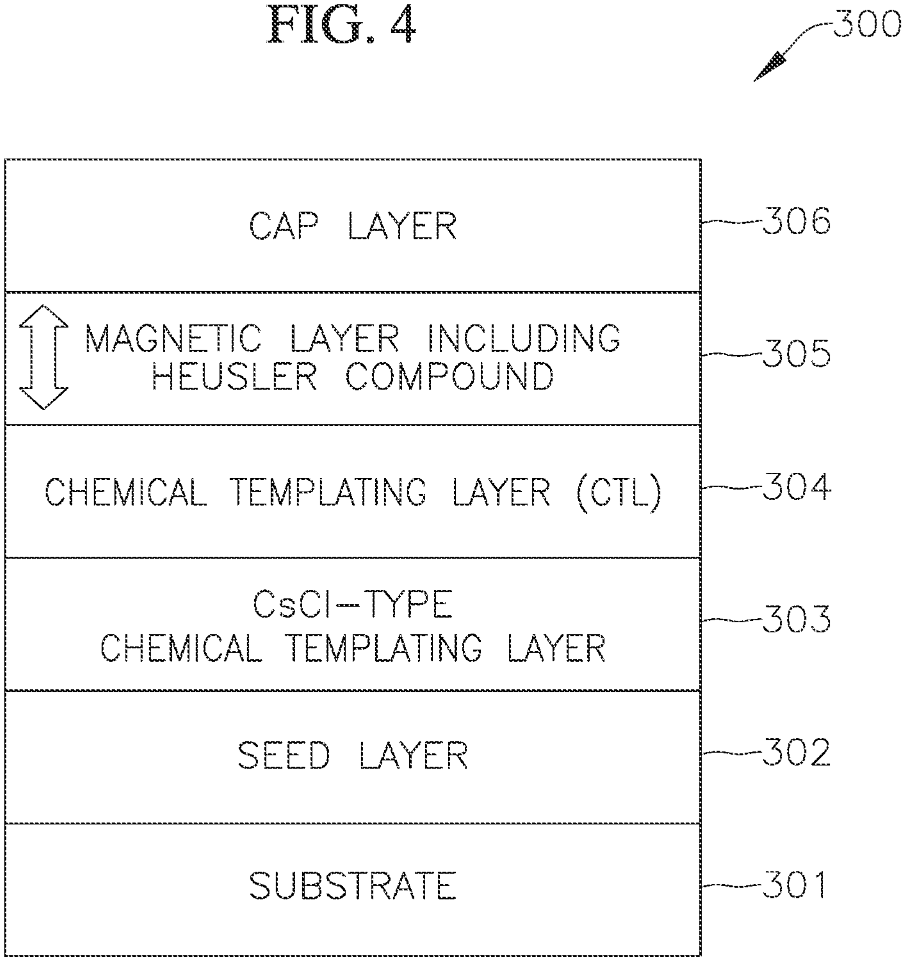
FIG. 4 is a cross-sectional view of a racetrack magnetic device according to one embodiment of the present disclosure.

With reference now to FIG. 4, a racetrack magnetic memory device 300 (i.e., a domain-wall memory (DWM) device) according to one embodiment of the present disclosure includes a substrate 301, a seed layer 302 above the substrate 301, a CsCl-type chemical templating layer 303 above the seed layer 302, a chemical templating layer 304 above the CsCl-type chemical templating layer 303, a magnetic layer 305 comprising a Heusler compound above the chemical templating layer 304, and a cap layer 306 above the magnetic layer 305. In one or more embodiments, the seed layer 302, the CsCl-type chemical templating layer 303, the chemical templating layer 304, the Heusler compound of the magnetic layer 305, and the cap layer 306 may be the same as the seed layer 102, the CsCl-type chemical templating layer 103, the chemical templating layer 104, the Heusler compound of the first magnetic layer 105, and the cap layer 110, respectively, as described above with reference to the embodiment of the magnetic memory device 100 illustrated in FIG. 1.

The magnetic layer 305 including the Heusler compound defines a racetrack. Bits are stored in the magnetic layer 305 as magnetic domains, and bits with opposite magnetic orientations are separated by domain walls along the magnetic layer 305. In operation, the domain walls are moved along the racetrack by passing electric current through the racetrack. Data stored in the racetrack are read by interrogating the orientation of magnetic moment between adjacent domain walls.

Figure 5:
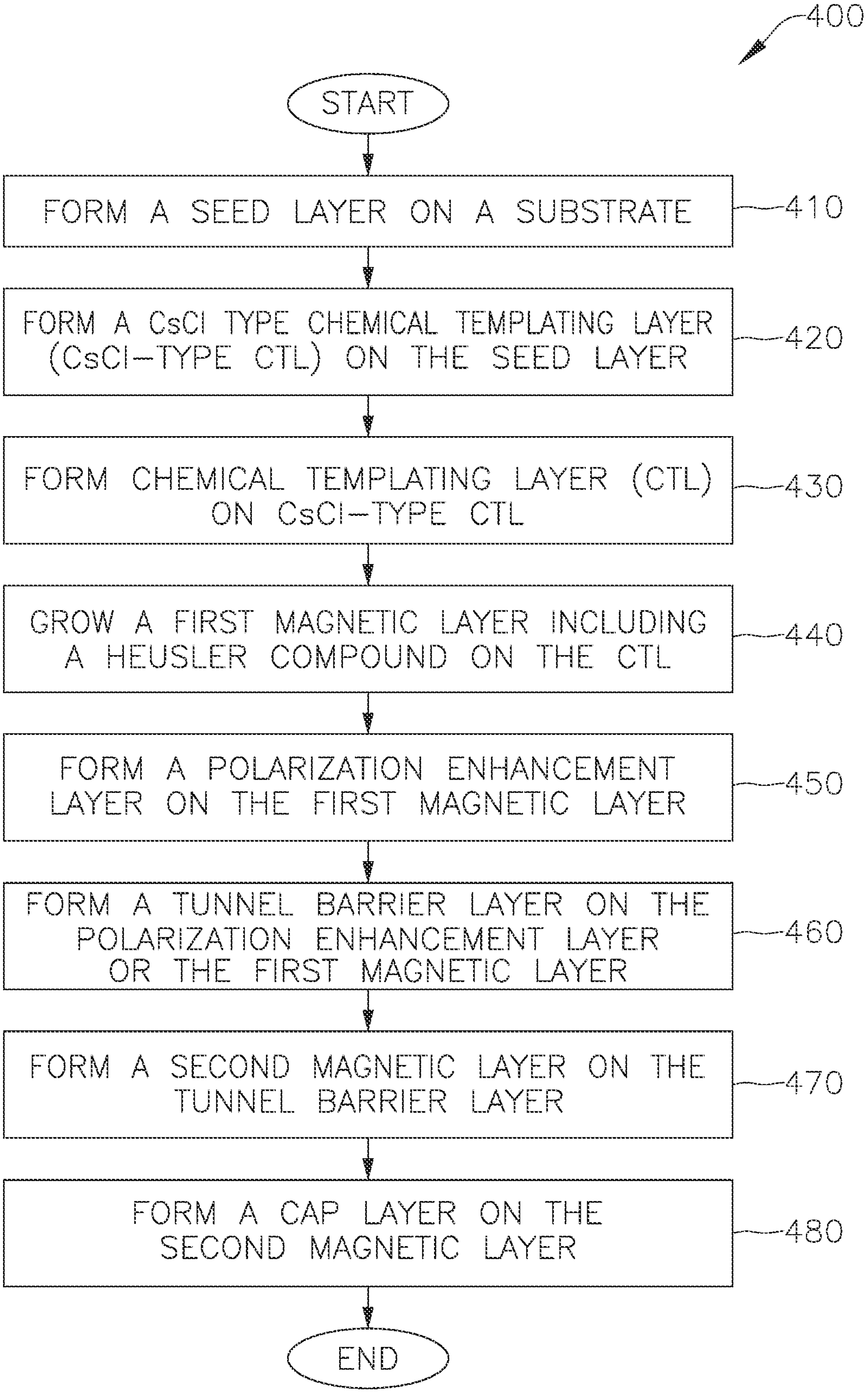
FIG. 5 is a flowchart illustrating tasks of a method of manufacturing a magnetic device according to one embodiment of the present disclosure.

FIG. 5 is a flowchart illustrating tasks of a method 400 of forming a magnetic memory device (e.g., a STT-MRAM device) according to one embodiment of the present disclosure.

In the illustrated embodiment, the method 400 includes a task 410 of forming (e.g., depositing) a seed layer on a substrate. In one or more embodiments, the seed layer formed in task 410 may include $Sc_xN$, $Mn_xN$, or MgO oriented (or substantially oriented) in the (001) direction.

In one or more embodiments, the method 400 also includes a task 420 of forming (e.g., depositing) a CsCl-type chemical templating layer including a binary compound having a CsCl prototype structure, such as CoAl (e.g., an alternating layered structure of cobalt (Co) atoms and aluminum (Al) atoms), oriented (or substantially oriented) in the (001) direction on the seed layer formed in task 410.

In the illustrated embodiment, the method 400 also includes a task 430 of forming a chemical templating layer on the CsCl-type chemical templating layer formed in task 420. In one or more embodiments, the chemical templating layer formed in task 430 includes a binary alloy having a $Cu_3Au$ prototype structure or a $BiF_3$ prototype structure. In one or more embodiments, the binary compound of the chemical templating layer is represented by $A_{1-x}E_x$, wherein A is a transition metal element, E is a main group element, and x is in a range from 0.2 to 0.3. For example, in one or more embodiments, A is cobalt (Co), nickel (Ni), scandium (Sc), copper (Cu), or iron (Fe), and E is aluminum (Al), germanium (Ge), or gallium (Ga) (e.g., the binary compound of the chemical templating layer may be $Co_3Al$, $Ni_3Al$, $Sc_3Al$, $Cu_3Al$, $Fe_3Al$, $Fe_3Ge$, $Ni_3Ge$, $Fe_3Ge$, $Co_3Ga$, $Fe_3Ga$, $Ni_3Ga$, $Sc_3Ga$, or $Fe_3Ga$).

In the illustrated embodiment, the method 400 also includes a task 440 of forming (e.g., growing) a magnetic layer including a Heusler compound on the chemical templating layer formed in task 430. During task 440, the chemical templating layer is configured to provide the Heusler compound with perpendicular magnetic anisotropy (PMA). In one or more embodiments, the Heusler compound of the first magnetic layer includes a plurality of layers alternating between a layer including only a transition metal element, and another layer including a main group element and a transition metal element. For instance, in one or more embodiments, the Heusler compound includes a plurality of layers alternating between a layer of Mn—Mn atoms and a layer of Mn—Ge atoms. In one or more embodiments, the Heusler compound in the first magnetic layer may be $Mn_3Z$, where Z is germanium (Ge), tin (Sn), or antimony (Sb). In one or more embodiments, the Heusler compound may be a tetragonal Heusler compound, such as $Mn_3Z$ in which Z is Ge, Sn, or Sb. For example, in one or more embodiments, the tetragonal Heusler compound may be $Mn_{3.3-x}Ge$, $Mn_{3.3-x}Sn$, or $Mn_{3.3-x}Sb$ in which x is in a range from 0 to 1.1. In one or more embodiments, the Heusler compound may be a ternary Heusler compound (e.g., $Mn_{3.3-x}Co_{1.1-y}Sn$, in which $x \leq 1.2$ and $y \leq 1.0$). In one or more embodiments, the Heusler compound may be $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, or $Co_2MnSi$.

In the illustrated embodiment, the method 400 also includes a task 450 of forming a polarization enhancement layer (PEL) on the first magnetic layer formed in task 440. In one or more embodiments, the method 400 may not include the task 450 of forming the PEL.

In the illustrated embodiment, the method 400 also includes a task 460 of forming a tunnel barrier layer on the polarization enhancement layer formed in task 450 or, if task 450 is not performed, on the magnetic layer formed in task 440. In one or more embodiments, the tunnel barrier layer may include MgO. In one or more embodiments, the tunnel barrier layer may be $MgAl_2O_4$ and the lattice spacing of the tunnel barrier layer can be tuned (engineered) by controlling the Mg—Al composition to result in better lattice matching with the Heusler compound of the first magnetic layer formed in task 440. For example, in one or more embodiments, the tunnel barrier layer can be represented as $Mg_{1-z}Al_{2+(2-3)z}O_4$ in which z is between −0.5 and 0.5.

In the illustrated embodiment, the method 400 also includes a task 470 of forming a second magnetic layer on the tunnel barrier layer formed in task 460.

Together, the first magnetic layer including the Heusler compound formed in task 440, the tunnel barrier layer formed in task 460, and the second magnetic layer formed in task 470 define a magnetic tunnel junction (MTJ). In one or more embodiments, the second magnetic layer may have a fixed (or pinned) magnetization direction and the magnetization direction (or state) of the first magnetic layer having the Heusler compound may be configured to switch to be either aligned or anti-aligned with the magnetization direction of the second magnetic layer using spin transfer torque (STT). In this case, the MTJ is a bi-stable system in which the second magnetic layer functions as a reference layer and the first magnetic layer including the Heusler compound functions as the bit storage layer. In one or more embodiments, the first magnetic layer may have a fixed (or pinned) magnetization direction and the magnetization direction (or state) of the second magnetic layer (which may include the Heusler compound) may be configured to switch to be either aligned or anti-aligned with the magnetization direction of the first magnetic layer using spin transfer torque (STT). In this case, the MTJ is a bi-stable system in which the first magnetic layer functions as a reference layer and the second magnetic layer (which may include the Heusler compound) functions as the bit storage layer.

In the illustrated embodiment, the method 400 also includes a task 480 of forming a cap layer on the second magnetic layer formed in task 470 to complete the formation of the magnetic memory device (e.g., the STT-MRAM device). In one embodiment, the cap layer formed in task 480 may be directly on the second magnetic layer formed in task 470. In one or more embodiments in which the second magnetic layer is the reference layer, the method 400 may include a task of depositing a tantalum (Ta) layer on the second magnetic layer before the task 480 of depositing the cap layer such that the cap layer is not directly on the second magnetic layer.

Figure 6:
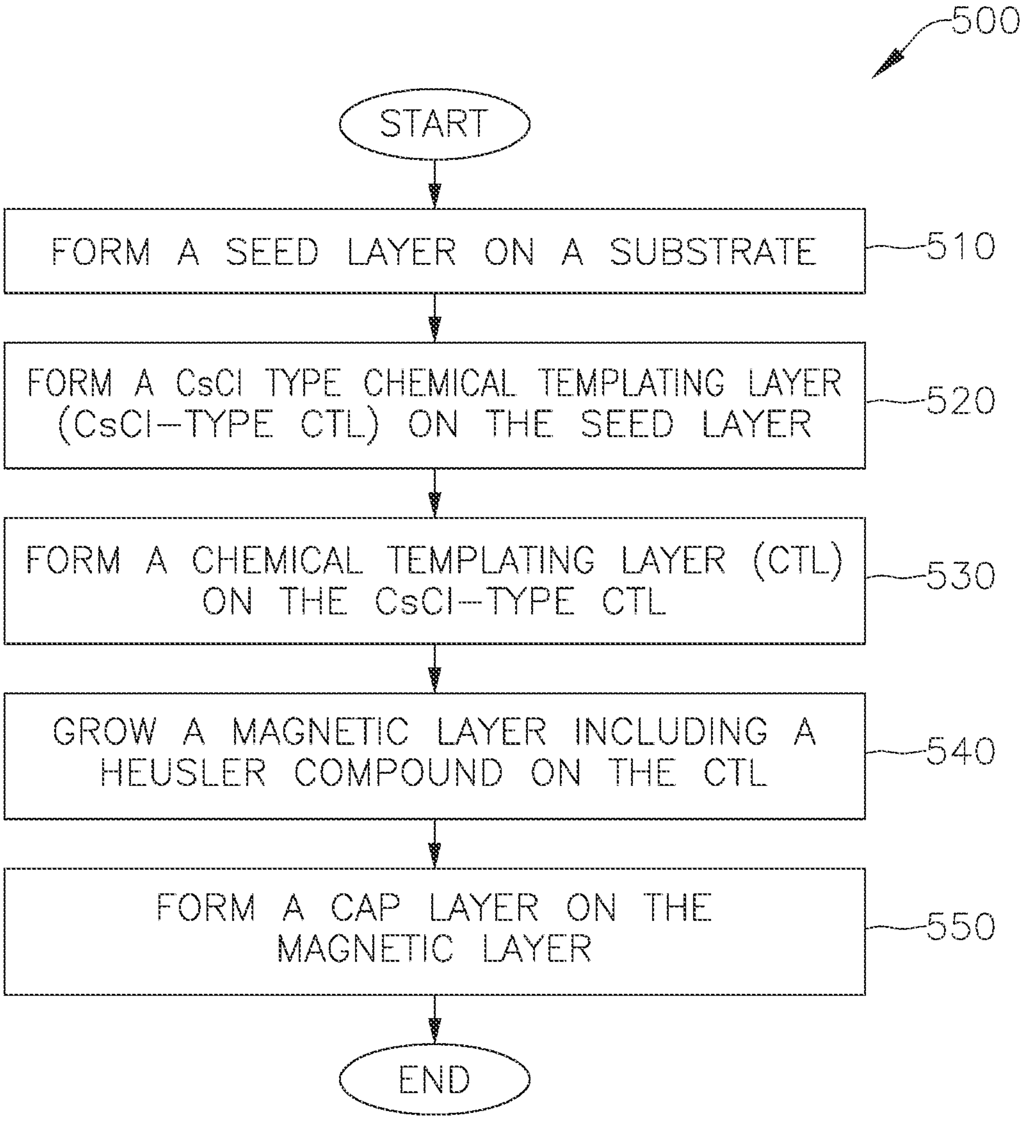
FIG. 6 is a flowchart illustrating tasks of a method of manufacturing a magnetic device according to another embodiment of the present disclosure

FIG. 6 is a flowchart illustrating tasks of a method 500 of forming a magnetic memory device (e.g., a DWM device) according to one embodiment of the present disclosure.

In the illustrated embodiment, the method 500 includes a task 510 of forming (e.g., depositing) a seed layer on a substrate. In one or more embodiments, the seed layer formed in task 510 may include $Sc_xN$, $Mn_xN$, or MgO oriented (or substantially oriented) in the (001) direction. In one or more embodiments, the seed layer formed in task 510 may include $Sc_xN$, wherein x is in a range from approximately 0.8 to approximately 1.2 (i.e., $0.8 \leq x \leq 1.2$), such as, for example, in a range from approximately 0.9 to approximately 1.1 (i.e., $0.9 \leq x \leq 1.1$). In one or more embodiments, the seed layer formed in task 510 may include $Mn_xN$, wherein x is in a range from approximately 1 to approximately 4.75 (i.e., $1 \leq x \leq 4.75$), such as, for example, in a range from approximately 2.5 to approximately 4 (i.e., $2.5 \leq x \leq 4$).

In one or more embodiments, the method 500 also includes a task 520 of forming (e.g., depositing) a CsCl-type chemical templating layer including a binary compound having a CsCl prototype structure, such as CoAl (e.g., an alternating layered structure of cobalt (Co) atoms and aluminum (Al) atoms), oriented (or substantially oriented) in the (001) direction on the seed layer formed in task 510.

In the illustrated embodiment, the method 500 also includes a task 530 of forming a chemical templating layer on the CsCl-type chemical templating layer formed in task 510. In one or more embodiments, the chemical templating layer formed in task 530 includes a binary alloy having a $Cu_3Au$ prototype structure or a $BiF_3$ prototype structure. In one or more embodiments, the binary compound of the chemical templating layer is represented by $A_{1-x}E_x$, wherein A is a transition metal element, E is a main group element, and x is in a range from 0.2 to 0.3. For example, in one or more embodiments, A is cobalt (Co), nickel (Ni), scandium (Sc), copper (Cu), or iron (Fe), and E is aluminum (Al), germanium (Ge), or gallium (Ga) (e.g., the binary compound of the chemical templating layer may be $Co_3Al$, $Ni_3Al$, $Sc_3Al$, $Cu_3Al$, $Fe_3Al$, $Fe_3Ge$, $Ni_3Ge$, $Fe_3Ge$, $Co_3Ga$, $Fe_3Ga$, $Ni_3Ga$, $Sc_3Ga$, or $Fe_3Ga$).

In the illustrated embodiment, the method 500 also includes a task 540 of forming (e.g., growing) a magnetic layer including a Heusler compound on the chemical templating layer formed in task 530. During task 540, the chemical templating layer is configured to provide the Heusler compound with perpendicular magnetic anisotropy (PMA). In one or more embodiments, the Heusler compound of the first magnetic layer includes a plurality of layers alternating between a layer including only a transition metal element, and another layer including a main group element and a transition metal element. For instance, in one or more embodiments, the Heusler compound includes a plurality of layers alternating between a layer of Mn—Mn atoms and a layer of Mn—Ge atoms. In one or more embodiments, the Heusler compound in the first magnetic layer may be $Mn_3Z$, where Z is germanium (Ge), tin (Sn), or antimony (Sb). In one or more embodiments, the Heusler compound may be a tetragonal Heusler compound, such as $Mn_3Z$ in which Z is Ge, Sn, or Sb. For example, in one or more embodiments, the tetragonal Heusler compound may be $Mn_{3.3-x}Ge$, $Mn_{3.3-x}Sn$, or $Mn_{3.3-x}Sb$ in which x is in a range from 0 to 1.1. In one or more embodiments, the Heusler compound may be a ternary Heusler compound (e.g., $Mn_{3.3-x}Co_{1.1-y}Sn$, in which $x \leq 1.2$ and $y \leq 1.0$). In one or more embodiments, the Heusler compound may be $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, or $Co_2MnSi$.

The magnetic layer including the Heusler compound formed in task 540 defines a racetrack. Bits are stored in the magnetic layer as magnetic domains, and bits with opposite magnetic orientations are separated by domain walls along the magnetic layer. In operation, the domain walls are moved along the racetrack by passing electric current through the racetrack. Data stored in the racetrack are read by interrogating the orientation of magnetic moment between adjacent domain walls.

In the illustrated embodiment, the method 500 also includes a task 550 of forming a cap layer on the magnetic layer formed in task 540 to complete the formation of the magnetic memory device (e.g., the DWM device).

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims.

What is claimed is:

1. A magnetic memory device comprising:

a substrate;

a seed layer above the substrate;

a chemical templating layer above the seed layer, the chemical templating layer comprising a binary alloy having a $Cu_3Au$ prototype structure or a $BiF_3$ prototype structure; and a first magnetic layer above the chemical templating layer, the first magnetic layer comprising a Heusler compound having perpendicular magnetic anisotropy.

2. The magnetic memory device of claim 1, wherein the seed layer comprises $Sc_xN$, $Mn_xN$, or MgO oriented in (001) direction.

3. The magnetic memory device of claim 1, wherein the Heusler compound is selected from the group consisting of $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, and $Co_2MnSi$.

4. The magnetic memory device of claim 1, wherein the Heusler compound is $Mn_3Ge$.

5. The magnetic memory device of claim 1, wherein the first magnetic layer has a thickness less than approximately 5 nm.

6. The magnetic memory device of claim 1, wherein the binary alloy is represented by $A_{1-x}E_x$, wherein A is a transition metal element and E is a main group element, and wherein x is in a range from 0.2 to 0.3.

7. The magnetic memory device of claim 6, wherein A is cobalt (Co), nickel (Ni), scandium (Sc), copper (Cu), or iron (Fe), and wherein E is aluminum (Al), germanium (Ge), or gallium (Ga).

8. The magnetic memory device of claim 1, further comprising a tunnel barrier layer above the first magnetic layer.

9. The magnetic memory device of claim 8, wherein the tunnel barrier layer comprises MgO.

10. The magnetic memory device of claim 8, wherein the tunnel barrier layer comprises $Mg_{1-z}Al_{2+(2/3)z}O_4$, wherein z is between −0.5 and 0.5.

11. The magnetic device of claim 10, wherein the tunnel barrier layer comprises $MgAl_2O_4$.

12. The magnetic memory device of claim 8, further comprising a second magnetic layer above the tunnel barrier layer.

13. The magnetic memory device of claim 12, wherein the first magnetic layer comprising the Heusler compound is a free magnetic layer, wherein the second magnetic layer is a pinned magnetic layer, and wherein the magnetic memory device further comprises a synthetic antiferromagnet (SAF) layer above the second magnetic layer.

14. The magnetic memory device of claim 12, wherein the first magnetic layer comprising the Heusler compound is a pinned magnetic layer, and wherein the second magnetic layer is a free magnetic layer.

15. The magnetic memory device of claim 12, further comprising a cap layer above the second magnetic layer.

16. The magnetic memory device of claim 1, further comprising a CsCl-type chemical templating layer above the seed layer, wherein the chemical templating layer is above the CsCl-type chemical templating layer, and wherein the CsCl-type chemical templating layer comprises CoAl.

17. A method of forming a magnetic memory device, the method comprising:

forming a seed layer above a substrate;

forming a chemical templating layer above the seed layer, the chemical templating layer comprising a binary alloy having a $Cu_3Au$ prototype structure or a $BiF_3$ prototype structure; and growing a first magnetic layer above the chemical templating layer, wherein the $Cu_3Au$ prototype structure or a $BiF_3$ prototype structure of the chemical templating layer causes the first magnetic layer to comprise a Heusler compound having perpendicular magnetic anisotropy.

18. The method of claim 17, wherein the binary alloy is represented by $A_{1-x}E_x$, wherein A is a transition metal element and E is a main group element, and wherein x is in a range from 0.2 to 0.3.

19. The method of claim 18, wherein A is cobalt (Co) or iron (Fe), and wherein E comprises at least one other element that includes aluminum (Al) or gallium (Ga).

20. The method of claim 17, further comprising forming a CsCl-type chemical templating layer above the seed layer, and wherein the forming the chemical templating layer comprises forming the chemical templating layer on the CsCl-type chemical templating layer.

* * * * *